United States Patent [19]

Shimada

[11] Patent Number: 5,731,652
[45] Date of Patent: Mar. 24, 1998

[54] POWER SOURCE UNIT EMPLOYING PIEZOELECTRIC TRANSFORMER FREQUENCY-CONTROLLED AND VOLTAGE-CONTROLLED TO OPERATE AT A MAXIMUM EFFICIENCY

[75] Inventor: Yasuhei Shimada, Tokyo, Japan

[73] Assignee: NEC Corporation, Tokyo, Japan

[21] Appl. No.: 613,224

[22] Filed: Mar. 8, 1996

[30] Foreign Application Priority Data

Mar. 8, 1995 [JP] Japan ................................ 7-047695

[51] Int. Cl.$^6$ ........................................ H02N 2/00
[52] U.S. Cl. ................................ 310/316; 310/354
[58] Field of Search ............................ 310/316, 354

[56] References Cited

U.S. PATENT DOCUMENTS

| | | | |
|---|---|---|---|
| 4,868,445 | 9/1989 | Wand | 310/316 |
| 4,952,834 | 8/1990 | Okada | 310/316 |
| 5,095,890 | 3/1992 | Houghton et al. | 310/316 |
| 5,216,338 | 6/1993 | Wilson | 310/316 |
| 5,329,200 | 7/1994 | Zaitsu | 310/316 |
| 5,355,047 | 10/1994 | Okada | 310/316 |
| 5,479,063 | 12/1995 | Suganuma | 310/316 |
| 5,500,565 | 3/1996 | Okubo | 310/316 |
| 5,563,478 | 10/1996 | Suganuma | 310/316 |
| 5,637,947 | 6/1997 | Kising et al. | 310/316 |
| 5,654,605 | 8/1997 | Kawashima | 310/316 |

FOREIGN PATENT DOCUMENTS

| | | |
|---|---|---|
| 61-220386 | 9/1986 | Japan . |
| 5-210773 | 7/1992 | Japan . |
| 5-64437 | 3/1993 | Japan . |
| 5-219730 | 8/1993 | Japan . |

OTHER PUBLICATIONS

S. Kawashima et al., "Third Order Longitudinal Mode Piezoelectric Ceramic Transformer and Its Application ... Inverter", *1994 IEEE Int'l Ultrasonics Symposium*, Nov. 1994, pp. 1–6.

*Primary Examiner*—Peter S. Wong
*Assistant Examiner*—Derek J. Jardieu
*Attorney, Agent, or Firm*—Sughrue, Mion, Zinn, Macpeak & Seas, PLLC

[57] ABSTRACT

A high power source unit employing a piezoelectric transformer detects whether the output of the piezoelectric transformer reaches a predetermined value or not using a comparator. Subsequently, using a frequency scanning circuit, an oscillation frequency of a driving frequency control circuit is scanned across a resonance frequency of the piezoelectric transformer. During this frequency scanning, the efficiency of the piezoelectric transformer is detected by a efficiency calculating circuit to detect the frequency where the efficiency becomes maximum, by a most efficient frequency detecting circuit. By maintaining this frequency, the piezoelectric transformer may operate at the frequency at optimal efficiency.

8 Claims, 8 Drawing Sheets

5,731,652

1

POWER SOURCE UNIT EMPLOYING PIEZOELECTRIC TRANSFORMER FREQUENCY-CONTROLLED AND VOLTAGE-CONTROLLED TO OPERATE AT A MAXIMUM EFFICIENCY

BACKGROUND OF THE INVENTION

1. Field of the Invention

The present invention relates generally to a power source unit. More specifically, the invention relates to a high voltage power source unit employing a piezoelectric transformer.

2. Description of the Related Art

As an example of this type of power source unit, there is a technology disclosed in Japanese Unexamined Patent Publication (Kokai) No. Heisei 5-219730. FIG. 7 is a block diagram of the power source unit, in which a drive voltage is applied to a primary side of the piezoelectric transformer 1 from a driver circuit 3 and an output at a secondary side is supplied to a cold-cathode flurorescent lamp (CCFL) 2 as a load.

The secondary output is detected by a resistor 16 and compared with a reference value by a comparator 9 for controlling a driving frequency of a driving frequency control circuit according to an error output of the comparator 9. The driving frequency control circuit 10 can control scanning of output frequency by a scanning output of a frequency scanning circuit 13.

By performing control of the scanning frequency depending upon the error output, the driving frequency is controlled so that the error output becomes zero, namely, the secondary output of the piezoelectric transformer 1 becomes constant. By the above mentioned construction, the output (current) of the power source unit can be constantly maintained, even when environmental temperature, power supply voltage Vin (15) or load condition is varied.

FIG. 8 shows a block diagram of another conventional power source unit which has been disclosed in Japanese Unexamined Patent Publication No. Heisei 4-210773. It should be noted that the like elements to FIG. 7 will be identified by like reference numerals.

In the example of FIG. 8, an output current detected by the resistor 16 is converted into a direct current level by a rectifying amplifier circuit 5 to control the driving frequency control circuit 10 and a driving voltage control circuit 6 on the basis of the converted output. The driving frequency control circuit 10 sets and controls the driving frequency in the vicinity of a resonance frequency of the piezoelectric transformer 1 and the driving voltage control circuit 6 sets and controls a duty ratio of the driving frequency signal. Accordingly, by simultaneously performing adjustment of the switching power of the driving frequency signal and adjustment of the voltage and the duty ratio, stable output control can be performed.

The known art as disclosed in former Japanese Unexamined Patent Publication No. Heisei 5-219730 encounters the following problems. In general, the piezoelectric transformer achieves the maximum efficiency in the vicinity of the resonance frequency, and the efficiency of transmission of the input power from the primary side to the secondary side is lowered according to increasing difference to the resonance frequency. Accordingly, in case of the load which operates at the frequency where the efficiency of the necessary current at the secondary side becomes maximum, the piezoelectric transformer may operate at maximum effi-

2 ciency. However, when the input voltage is high, or load at the secondary side is light, the driving frequency is shifted to the higher frequency from the resonance frequency for driving the load at a frequency where a transforming ratio is low to supply a constant current to the load at the secondary side.

In this control method, when a fluctuation of the power source to be supplied to the system is large or in the case of load causing load fluctuation, it is inevitable to operate at the frequency where the efficiency is low.

On the other hand, in case of the other known art as disclosed in Japanese Unexamined Patent Publication No. Heisei 4-210773, in addition to the frequency control of the former Japanese Unexamined Patent Publication No. Heisei 5-219730, the output of the piezoelectric transformer is controlled by controlling the duty ratio of the drive signal. When two controls for the frequency and the driving voltage are performed simultaneously, it is possible to apply a large input to the piezoelectric transformer under the condition where the transforming ratio is lowered by shifting the frequency for driving the piezoelectric transformer from the resonance frequency. Therefore, the piezoelectric transformer may operate at a frequency further lowering efficiency.

As set froth above, in the prior art, when the input voltage is varied or the load condition is varied, it is possible that control for operating the piezoelectric transformer efficiently cannot be performed.

SUMMARY OF THE INVENTION

Therefore, it is an object of the present invention to provide a power source unit which can efficiently operate with respect to fluctuation of an input power source and/or a load, constantly.

In order to accomplish the above-mentioned and other objects, according to one aspect of the invention, a power source unit comprises:

a piezoelectric transformer for converting an alternating voltage supplied to a primary side utilizing piezoelectric effect into an alternating voltage at a secondary side;

driving frequency controlling means for controlling a driving frequency of the piezoelectric transformer;

driving voltage control means for controlling a driving voltage supplied to the primary side of the piezoelectric transformer;

efficiency calculating for calculating an efficiency by utilizing an input power and an output power of the piezoelectric transformer;

most efficient frequency detecting means for detecting a driving frequency of the piezoelectric transformer when the maximum efficiency is detected by the efficiency calculating means; and control means for detecting a first driving frequency when the secondary output of the piezoelectric transformer becomes a predetermined value by controlling the driving frequency, initiating scanning of the driving frequency from the first driving frequency by the driving frequency controlling means with controlling the driving voltage by the driving voltage controlling means, and setting the driving frequency to the most efficient frequency when the most efficient frequency is detected by the most efficient frequency detecting means.

In the preferred construction, the control means may detect and control the most efficient frequency at a predetermined interval by the most efficient frequency detecting means after setting the driving frequency at the most efficient frequency, and setting the driving frequency to newly detected most efficient frequency. The driving frequency controlling means may control to perform scanning at least within a frequency range from a first driving frequency to a second frequency at which the predetermined output value is obtained.

The driving frequency control means may include voltage controlled oscillation means, control voltage generating means for generating control voltages of the voltage controlled oscillation means for oscillating frequencies at least between the first driving frequency and the second driving frequency, the driving voltage control means may include level comparing means for comparing a level of oscillation output of the voltage controlled oscillation means and a threshold voltage, and driving of the primary side of the piezoelectric transformer may be controlled by the comparison output of the level comparing means.

The oscillation output may be a triangular wave voltage and the comparison output of the comparing means is a drive pulse having a duty ratio corresponding to the level of the threshold voltage. The threshold voltage may be a constant voltage where the driving voltage becomes the maximum value before the secondary output of the piezoelectric transformer reaches the predetermined value. On the other hand, the threshold value may be proportional to the secondary output voltage of the piezoelectric transformer after the secondary output of the piezoelectric transformer reaches the predetermined value.

In the preferred construction, the control means may be realized by a software program.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are mot shown in detail so as not to unnecessarily obscure the present invention.

Figure 1:
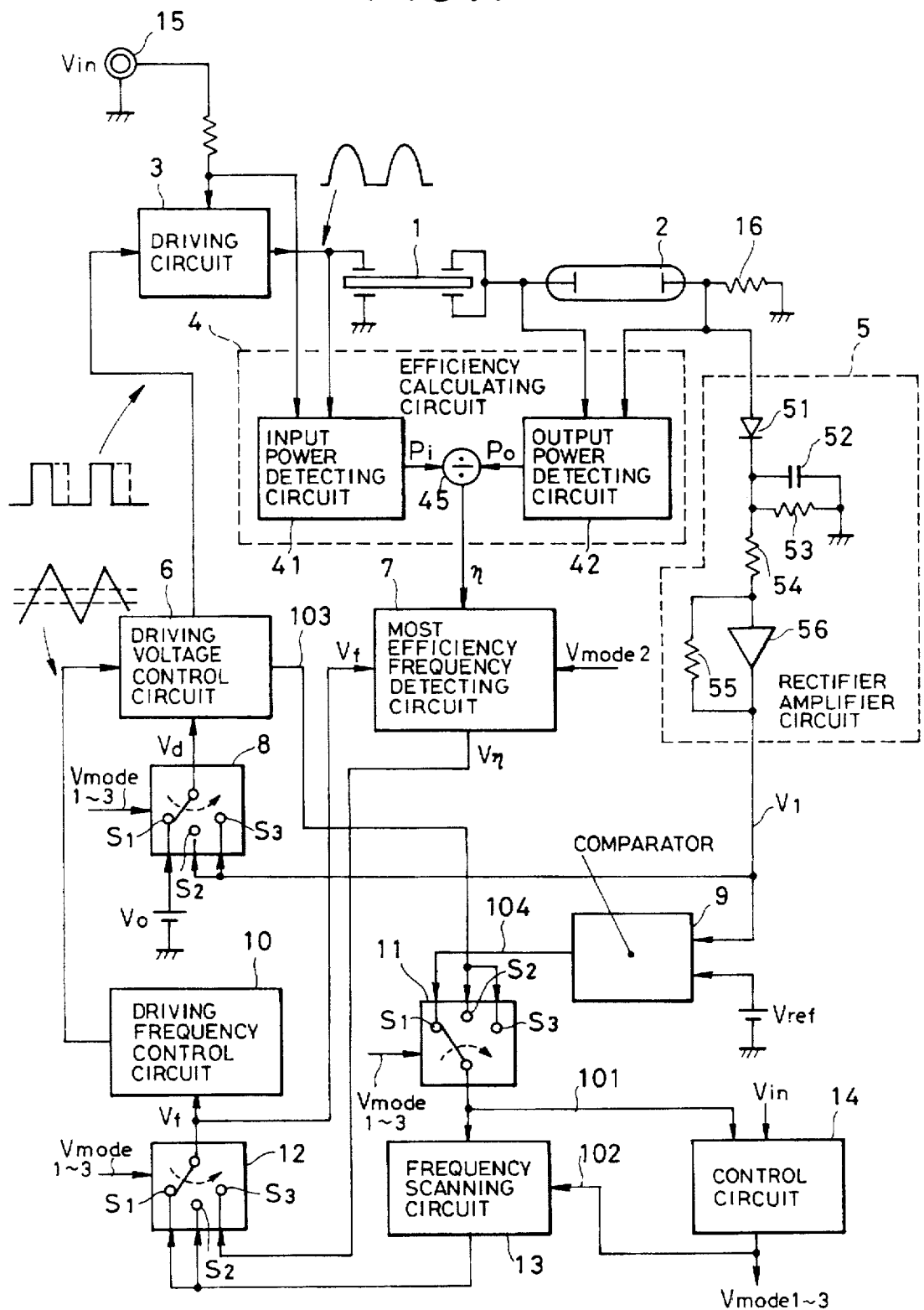
FIG. 1 is a block diagram of one embodiment of a power source unit according to the present invention.

FIG. 1 is a block diagram of one embodiment of the power source unit according to the present invention. A piezoelectric transformer 1 is an element which can transform a voltage level similarly to an electromagnetic transformer by a electromechanical transforming operation by a piezoelectric effect of a ferroelectric body. A driving pulse in the vicinity of a resonance frequency is applied to a primary side electrode of the piezoelectric transformer 1 by a driver circuit 3 to obtain an output voltage from a secondary side electrode. Thus a high voltage power source unit is constructed. It should be noted that a load at the secondary side is a cold-cathode fluorescent lamp (CCFL) 2.

A resistor 16 provided in series with the cold-cathode fluorescent lamp (CCFL) 2 is adapted to detect an output current to convert into a voltage. The detected voltage is converted into a direct current voltage by a rectifier amplifier circuit 5. The rectifier amplifier circuit 5 is constructed with a rectifier diode 51, a smoothing capacitor 52, resistors 53 to 55 and an amplifier 56.

An efficiency calculation circuit 4 comprises an input power detecting circuit 41 for detecting an input power Pi of the piezoelectric transformer 1, an output power detecting circuit 42 for detecting an output power Po of the piezoelectric transformer 1, and a divider circuit 45 for calculating Po/Pi for detecting a power efficiency η. A most efficient frequency detecting circuit 7 stores a control voltage Vf of a driving frequency control circuit 10, at which the efficiency η calculated by an efficiency calculating circuit 4 becomes maximum and output as Vη.

A comparator 9 compares the direct current output V1 of the rectifier amplifier circuit 5 and a reference level Vref to generate a matching signal 104 when both are matched with each other and applies the signal 104 to a control circuit 14 and a frequency scanning circuit 13 as a scanning stop signal 101 via a contact point S1 of a switch 11.

The control circuit 14 is responsive to an ON-set of a system power source Vin (15) to generate a control mode signal Vmode1, and is responsive to the scanning stop signal 101 input through the switch 11 to generate control mode signals Vmode2 and Vmode3.

The frequency scanning circuit 13 takes the control mode signal Vmode1 as a scanning start signal to generate a scanning signal gradually lowering from a maximum frequency fmax of the driving frequency control circuit 10 to a first frequency f1, and responsive to a scanning stop signal 101 supplied from the switch 11 to stop scanning.

The driving frequency control circuit 10 varies the frequency according to a scanning signal Vf input via a switch 12 and generates a triangular signal.

The driving voltage control circuit 6 compares the triangular signal and a threshold voltage Vd to generate a pulse signal. The driving voltage control circuit 6 performs a level comparator function for generating the pulse having larger duty ratio when the threshold voltage Vd is smaller, and the pulse having smaller duty ratio when the threshold value is greater.

The threshold voltage Vd is selected by a switch 8, which selects one of a fixed voltage value Vo and the output voltage V1 of the rectifier amplifier circuit 5.

The output pulse of the driving voltage control circuit 6 is input to the driving circuit 3 and thus applied to the primary side of the piezoelectric transformer 1. On the other hand, when the duty ratio of the generated pulse reaches the maximum value of the predetermined duty ratio, the driving voltage control circuit 6 detects the generated pulse reaching the predetermined duty ratio, generates the scanning stop signal 103 and supplies the scanning stop signal to the control circuit 14 or the frequency scanning circuit 13 via the contacts S2 and S3 of the switch 11.

The switches 8, 11 and 12 are controlled by the control mode signals Vmode 1 to Vmode 3 of the control circuit 14.

Figure 3:
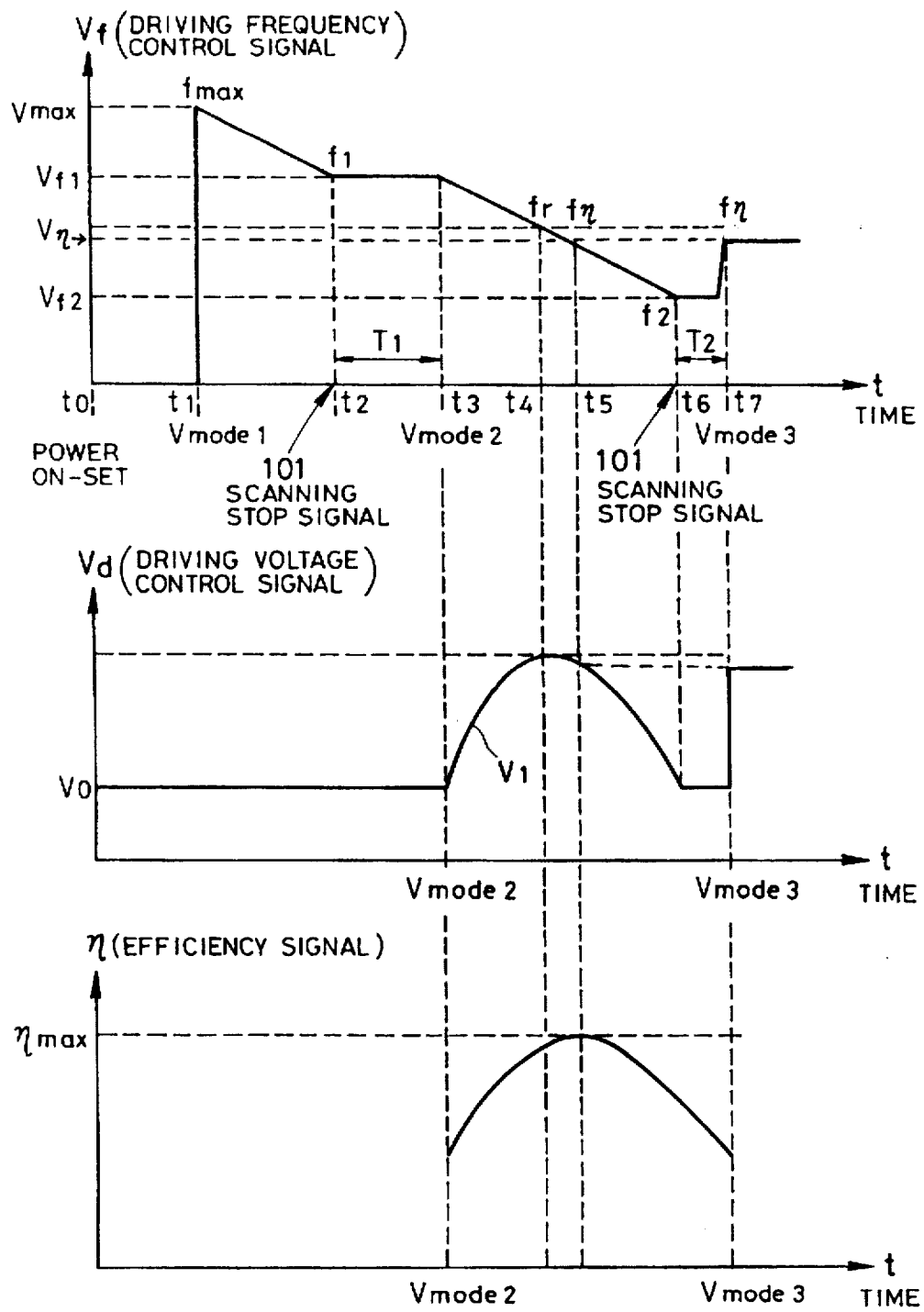
FIG. 3 is a timing chart showing operation of the embodiment of FIG. 1.

FIG. 3 are respective signal waveforms showing operation of the circuit of FIG. 1, and discussion will be given hereinafter with reference to FIGS. 1 and 3. At first, when an input voltage is applied to an input terminal 15 at a timing t0, the voltage is supplied to the overall circuit of FIG. 1 to make respective circuit active. The control circuit 14, at first, generates the control mode signal Vmode1. In response to this control mode signal Vmode1, switches 8, 11 and 12 are placed in states for selecting input signal at respective contacts S1.

At a time t1, the frequency scanning circuit 13 outputs the control voltage of Vmax in response to the Vmode1 signal. The driving frequency control circuit 10 receives the control voltage via the switch 12. This circuit 10 is a voltage controlled oscillator at (VCO) which oscillates a frequency proportional to the input voltage Vf, and outputs the output waveform of triangular wave. In response to the input Vmax signal, the driving frequency control circuit 10 outputs a signal having a frequency of fmax as the frequency higher than the resonance frequency of the piezoelectric transformer 1 to the driving voltage control circuit 6.

The driving voltage control circuit 6 is constructed with a comparator and converts the triangular wave input from the drivingfrequency control circuit 10 into a binary pulse signal by the threshold voltage Vd as another input signal. When the signal voltage of the Vd is smaller, the driving voltage control circuit 6 outputs a signal having large duty ratio, and when the signal of Vd is greater, the driving voltage control circuit 6 outputs the signal having small duty ratio. When the control circuit 14 outputs the signal of Vmode 1, a signal of the fixed value V0 is input as Vd. By this fixed value V0 signal, the pulse having the maximum duty ratio is output to the driver circuit 3.

The driver circuit 3 is a circuit constructed with the forward type inverter employing the electromagnetic transformer, which switches the direct current Vin input from the input terminal 15 with the pulse from the driving voltage control circuit 6 for outputting a pulse of halfwave of sinewave to the piezoelectric transformer 1. Since the output voltage of the driver circuit 3 is proportional to the duty ratio of the pulse from the driving voltage control circuit 6, the piezoelectric transformer 1 is driven at the maximum voltage in the state outputting the signal of Vmode 1.

By a high voltage output from the piezoelectric transformer 1, the cold-cathode fluorescent lamp (CCFL) 2 is illuminated. Then, a voltage proportional to the output current of the piezoelectric transformer 1 is obtained at both ends of the resistor 16. The voltage is converted into the output signal V1 by the rectifier amplifier circuit 5. The output signal v1 is compared with the reference signal Vref by the comparator 9. The comparator 9 outputs an output matching signal 104 when a level of the output signal V1 reaches to a level of the reference signal Vref. The matching signal 104 is past through the switch 11 to be the scanning stop signal 101 and then is input to the frequency scanning circuit 13 (timing t2).

After outputting the signal of Vmax subsequently to ON-set of the power source, the frequency scanning circuit 13 performs operation for gradually lowering output voltage. Then, the driving frequency of the piezoelectric transformer 1 approaches the resonance frequency fr. Then, the current of the cold-cathode fluorescent lamp (CCFL) 2 continuously increases to increase the current value corresponding to the reference value Vref. However, in response to the matching signal 104, lowering of the output voltage of the frequency scanning circuit 13 is stopped to output the constant voltage Vf1 to make the driving frequency stable at f1. The frequency f1 becomes the maximum frequency, at which the output current obtained from the piezoelectric transformer 1 is the current greater than or equal to the current corresponding to the set value Vref.

The matching signal 104 is simultaneously input to the control circuit 14 via the switch 11. In response to the signal 104, after a given period T1 (time t3), the control circuit 14 outputs the signal Vmode2. Then, contacts S2 of respective switches are selected. On the other hand, the Vmode 2 signal makes to resume scanning of the frequency scanning circuit 13, and gradually lowers the output voltage. Since the contact S2 of the switch 12 is selected, the control voltage Vf of the driving frequency control circuit 10 is also continuously lowered.

At this condition, the transforming ratio is increased since the driving frequency approaches the resonance frequency fr of the piezoelectric transformer 1, the current flowing of the cold-cathode fluorescent lamp (CCFL) 2 is start to increase. The output signal V1 of the rectifier amplifier circuit 5 is input as the threshold voltage Vd for the driving voltage control circuit 6 via the switch 8. Therefore, the duty ratio of the pulse output to the driving circuit 3 is decreased to perform operation for holding the current value. By the control set forth above, even when the transforming ratio is varied by lowering of the drivingfrequency of the piezoelectric transformer 1, the current flowing in the cold-cathode fluorescent lamp (CCFL) 2 is not varied.

When this state is continued, the driving frequency becomes lower than the resonance frequency fr of the piezoelectric transformer 1. Thus, the transforming ratio starts to be decreased to increase the duty ratio output by the driving voltage control circuit 6 and finally reach a limit of the set value of the circuit 6. The driving voltage control circuit 6 outputs the input voltage maximum signal 103. The input voltage maximum signal 103 becomes the scanning stop signal past through the switch 11. In response to the scanning stop signal, the frequency scanning circuit 13 stops the scanning of the output voltage to maintain the output voltage at Vf2 (time t6). At this time, the frequency f2 driving the piezoelectric transformer 1 is the minimum frequency to be taken out the set current (current corresponding to Vref) at the lower side of the resonance frequency fr of the piezoelectric transformer 1. Therefore, when the input voltage is Vin, f1 to f2 can be obtained as the frequency range to take out the set output current.

On the other hand, the efficiency calculation circuit 4 measures the input power and the output power of the piezoelectric transformer 1 and outputs the efficiency signal η to the most efficient frequency detecting circuit 7. The most efficient frequency detecting circuit 7 is constructed to hold the control voltage Vf in the state where the efficiency signal η input during the Vmode2 signal state becomes the maximum value. Thus, f1 to f2 can be obtained as the frequency range to take out the set output current.

On the other hand, the control circuit 14 receiving the scanning stop signal outputs Vmode3 at time t7 a given period T2 after the time t6. In response to this signal, the contacts S3 of respective switches are selected, the switch 12 outputs $V\eta$ to the driving frequency control circuit 10 and thus the driving frequency is fixed at $f\eta$. Then, the current of the cold-cathode fluorescent lamp (CCFL) 2 is controlled to be constant similarly to Vmode2 by the driving power control circuit 6 and thus becomes constant. Therefore, even when the input voltage is varied or the state of the load of the piezoelectric transformer is varied, the frequency becomes the value at which the maximum efficiency is attained.

FIG. 3 is a timing chart showing the driving frequency control signal Vf, the driving voltage control signal Vd and the efficiency signal $V\eta$. The driving frequency control signal Vf becomes maximum value by the Vmode1 signal after ON-set of power supply and then gradually lowered, and when the scanning stop signal 101 is input to the frequency scanning circuit 13, the voltage Vf1 is continuously output. Next, the mode signal is switched into Vmode2, then the voltage of the driving frequency control signal Vf is lowered according to elapsed time.

On the other hand, since the driving voltage control circuit 6 is input the voltage V0 after ON-set of power supply, the driver circuit 3 is placed in the state for driving the piezoelectric transformer at the maximum voltage. Therefore, at the frequency lower than or equal to f1 in the higher frequency side, in which the set current can be flown through the cold-cathode fluorescent lamp (CCFL) 2, the voltage to be applied to the piezoelectric transformer can be lowered.

During Vmode2 signal state, since the output signal V1 is input to the driving voltage control circuit 6, the driving voltage control circuit 6 is held in the state to control the voltage to be applied to the piezoelectric transformer by increasing and decreasing of the output signal V1. Therefore, while the frequency scanning circuit 13 varies the driving frequency from f1 to f2, the driving voltage control signal Vd becomes maximum in the vicinity of the resonance frequency fr. Namely, the piezoelectric transformer 1 is driven at the lowest voltage. Also, in the range lower than or equal to the frequency fr, the driving voltage control signal Vd is gradually lowered to gradually increase the duty ratio of the output of the driving voltage control circuit 6 to increase the driving voltage of the piezoelectric transformer. When the duty ratio becomes the set value of the circuit 6, the input voltage maximum signal 103 is output and the frequency is f2. During Vmode2 signal state, the efficiency calculation circuit 4 calculates the efficiency $\eta$. Thus, the voltage $V\eta$ which becomes maximum in the vicinity of the resonance frequency fr is output.

Figure 4:
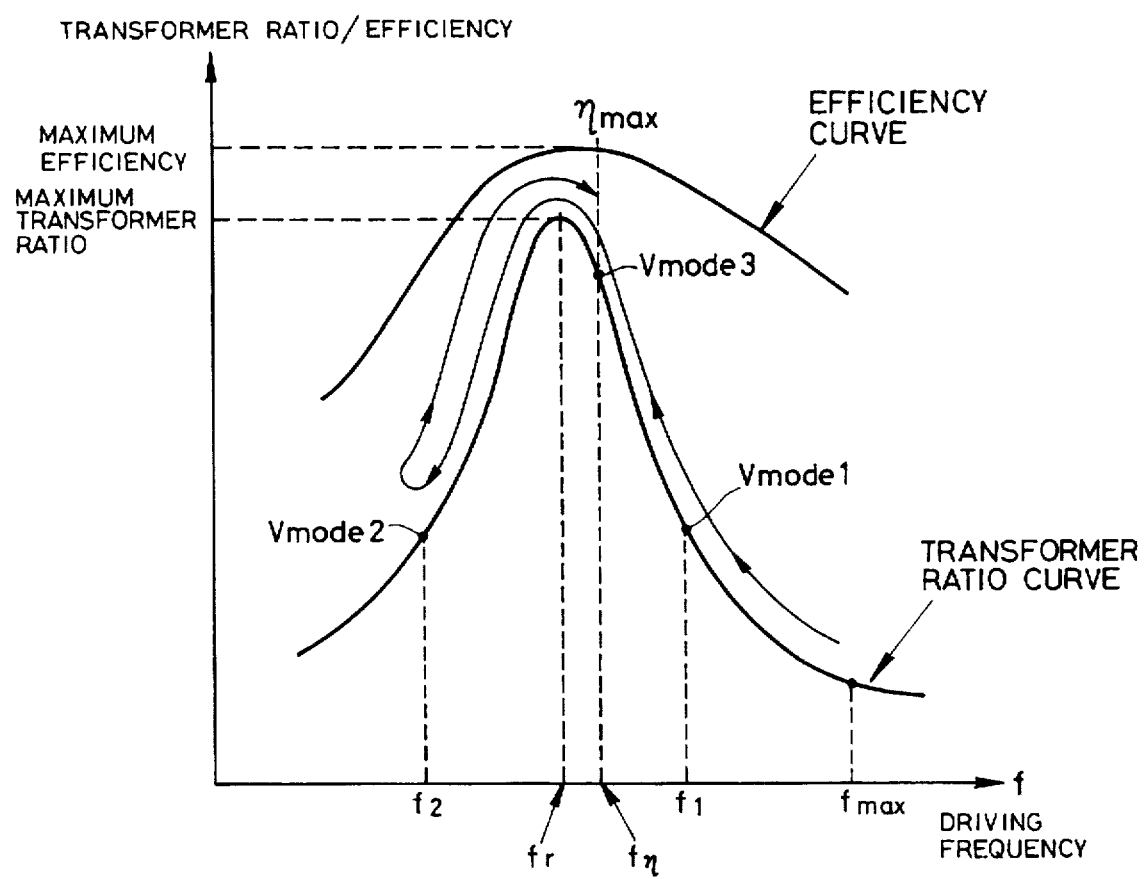
FIG. 4 is an illustration showing a transition state of the driving frequency in the embodiment of FIG. 1.

FIG. 4 is an illustration showing transition of the driving frequency after ON-set of power supply based on the frequency characteristics of the piezoelectric transformer. Upon ON-set of power supply, the driving is initiated at the frequency of fmax and the driving frequency is lowered until the frequency f1 corresponding to the set output current is obtained. Next, while maintaining the output current at the set value until f2, the efficiency is measured for seeking for $f\eta$, and finally, the driving frequency is risen to this frequency $f\eta$ to continue operation.

Figure 2:
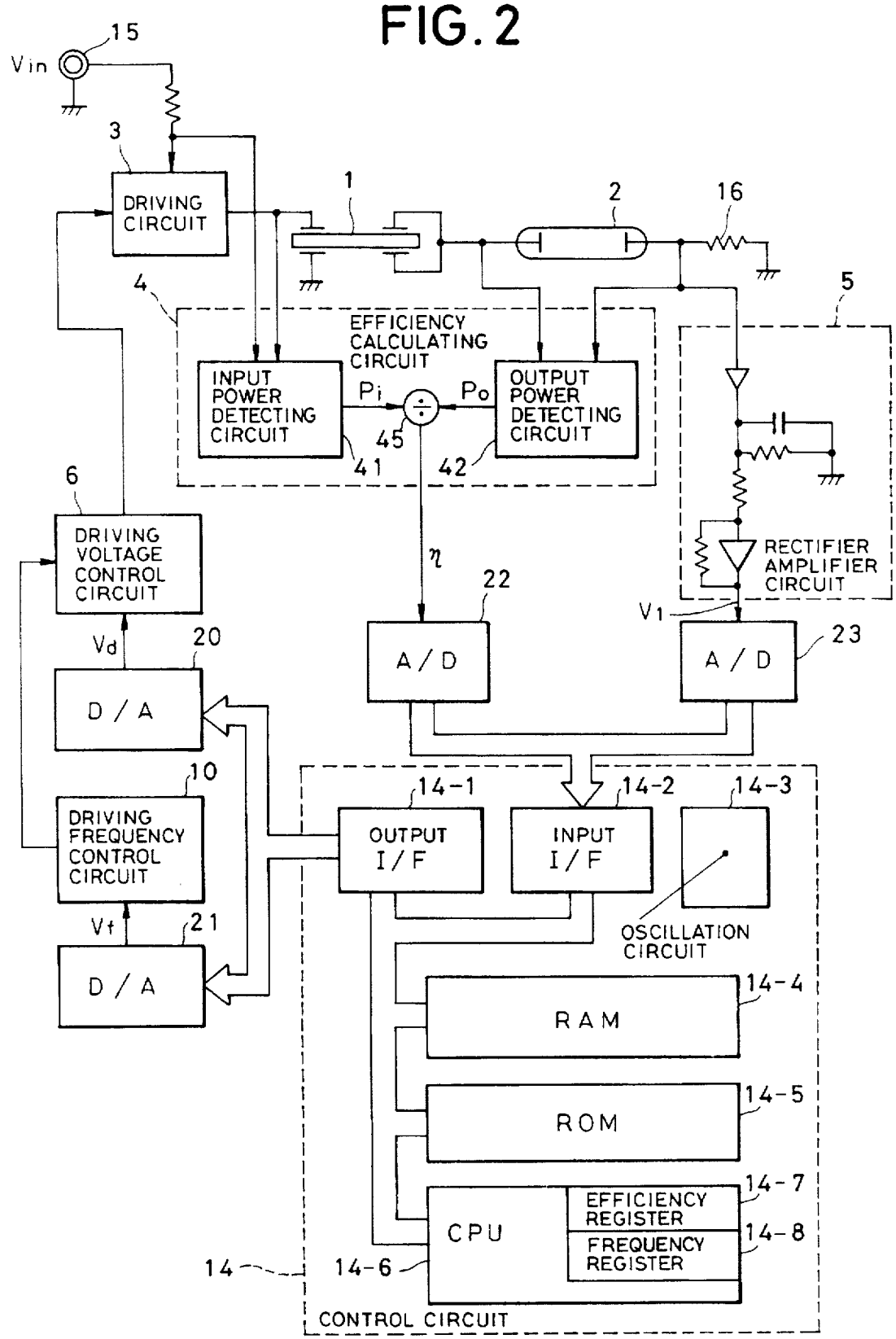
FIG. 2 is a block diagram showing another embodiment of a power source unit according to the present invention.

FIG. 2 shows another embodiment of the power source unit according to the present invention. The some of the circuit to perform control in digital manner are realized by the software. The basic operation is the equivalent to FIG. 1, and only different portion would be discussed hereinafter.

The control circuit 14 consists of a microprocessor and internally constructed as follow. Namely, the control circuit 14 includes an output interface (I/F) 14-1, an input interface 14-2, the oscillation circuit 14-3, RAM 14-4, ROM 14-5, CPU 14-6, the efficiency register 14-7, and a frequency register 14-8.

Furthermore, there are provided with digital-to-analog (hereinafter expressed as D/A) converters 20, 21 and analog-to-digital (hereinafter expressed as A/D) converters 22, 23.

The control method of the shown circuit will be discussed with reference to flowcharts of FIGS. 5 and 6. In the circuit of FIG. 2, the output signal V1 from the rectifier amplifier circuit 5 is converted into a digital signal by the A/D converter 23. This signal applied to the CPU 14-6 via the input I/F 14-1 and is processed according to a control program written in ROM 14-5. Similarly, the efficiency signal $\eta$ is also converted into the digital signal by the A/D converter 22 and input to the input I/F 14-2.

On the other hand, the control circuit 14 outputs the digital signal of Vf to the D/A converter 21 via the output I/F 14-1. The analog output signal Vf is applied to the driving frequency control circuit 10 and the circuit 10 performs driving frequency control according to the signal Vf. Similarly, the driving voltage control circuit 6 performs driving voltage control by the Vd signal output from the D/A converter 20.

Figure 5:
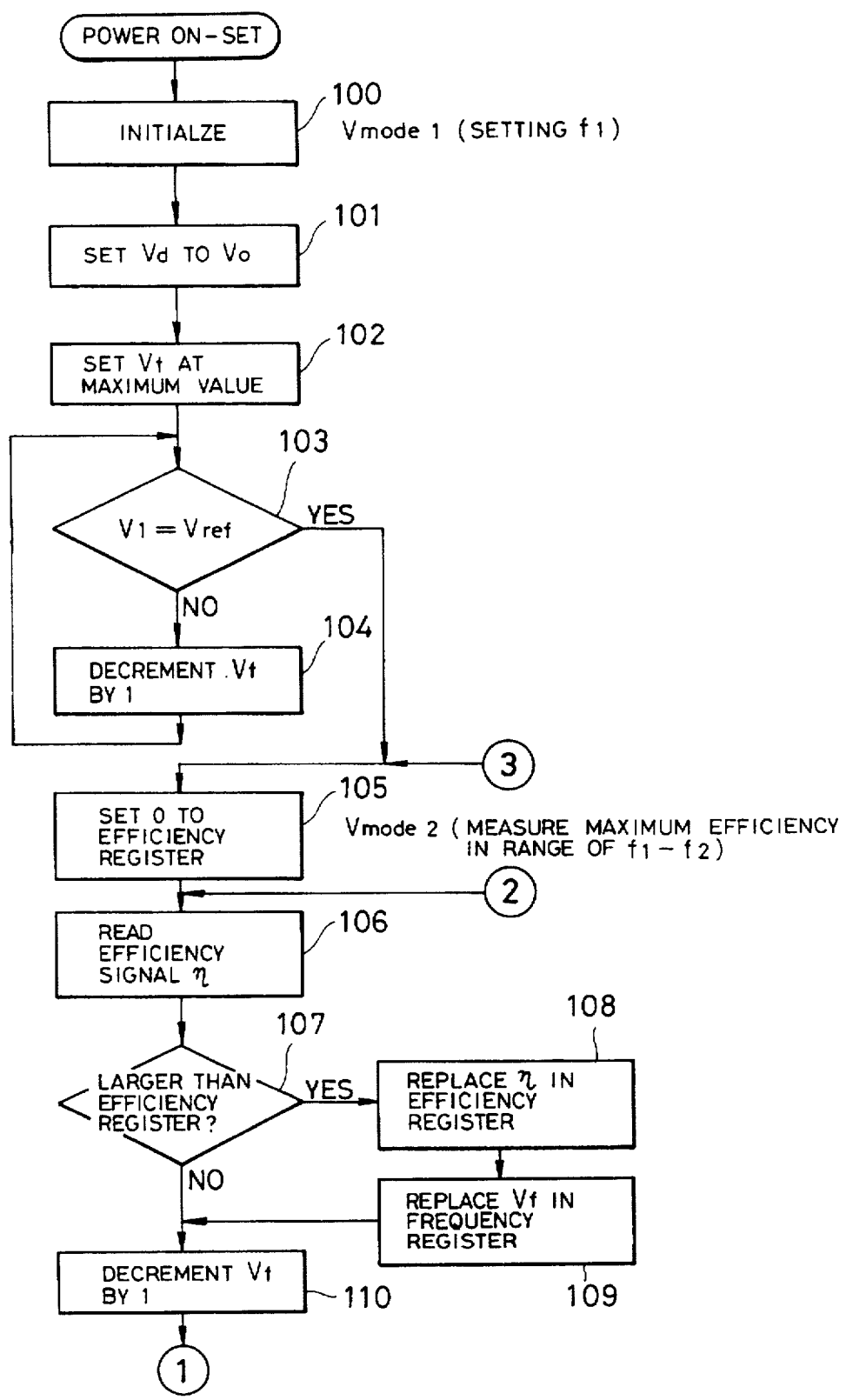
FIG. 5 is a flowchart of the embodiment of FIG. 2.
Figure 6:
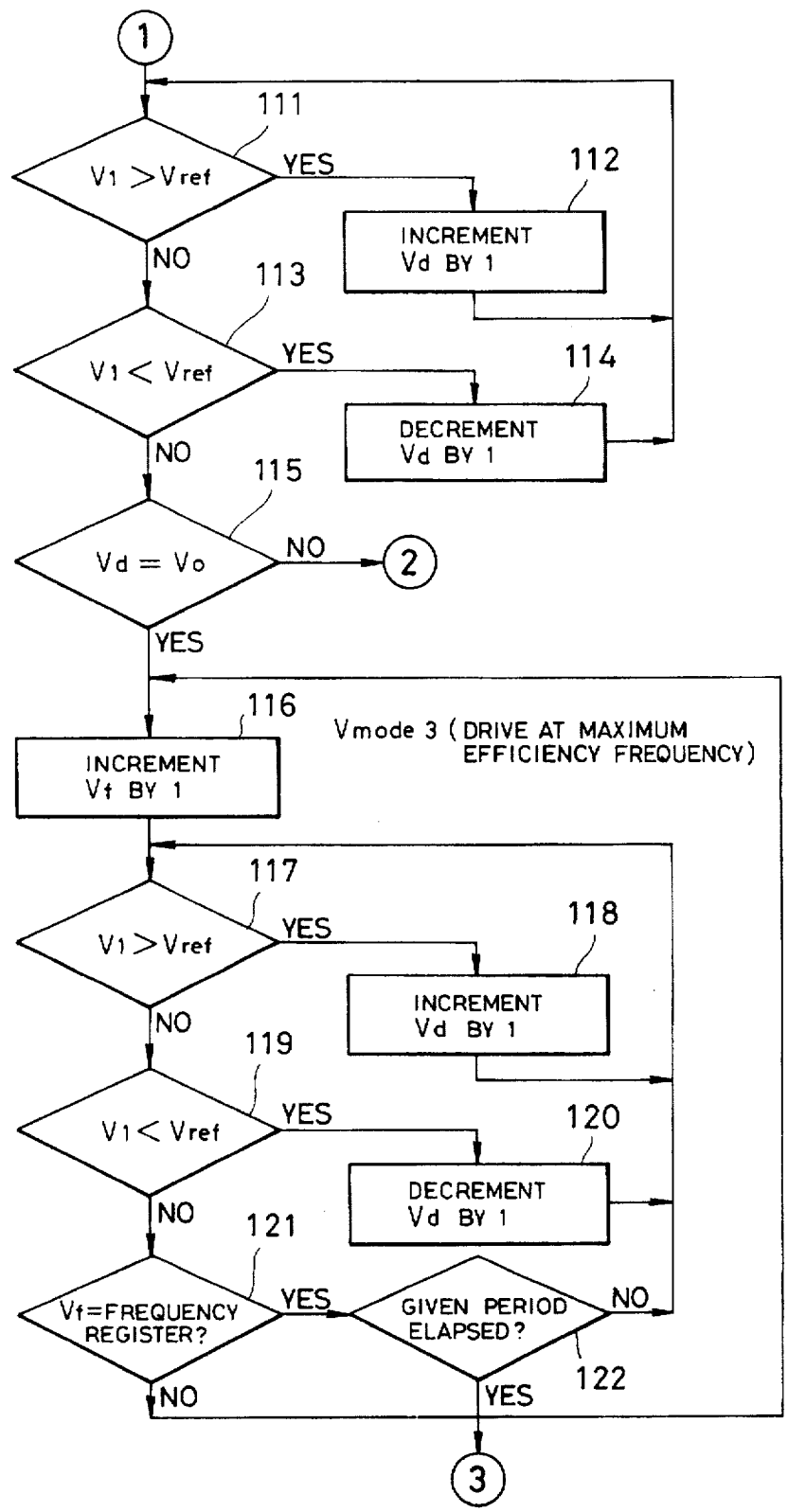
FIG. 6 is a flowchart of the embodiment of FIG. 2.
Figure 7:
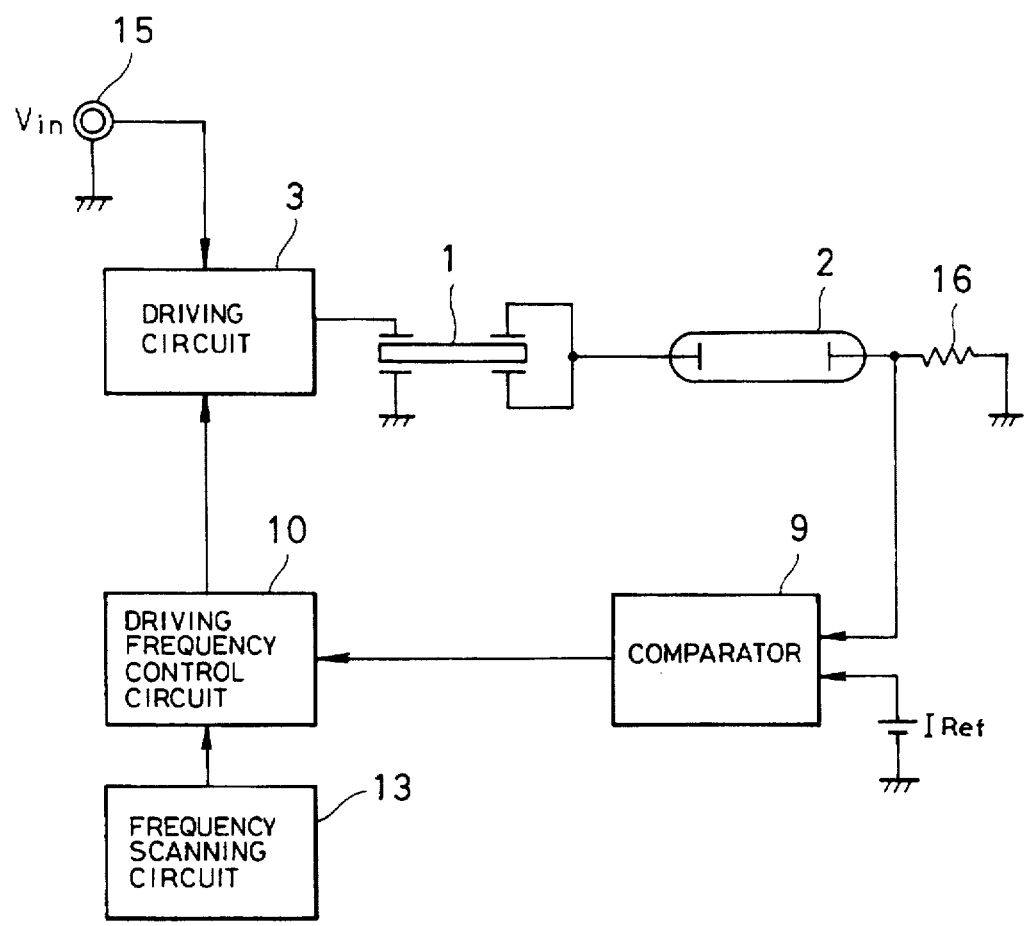
FIG. 7 is a block diagram showing one example of the prior art.
Figure 8:
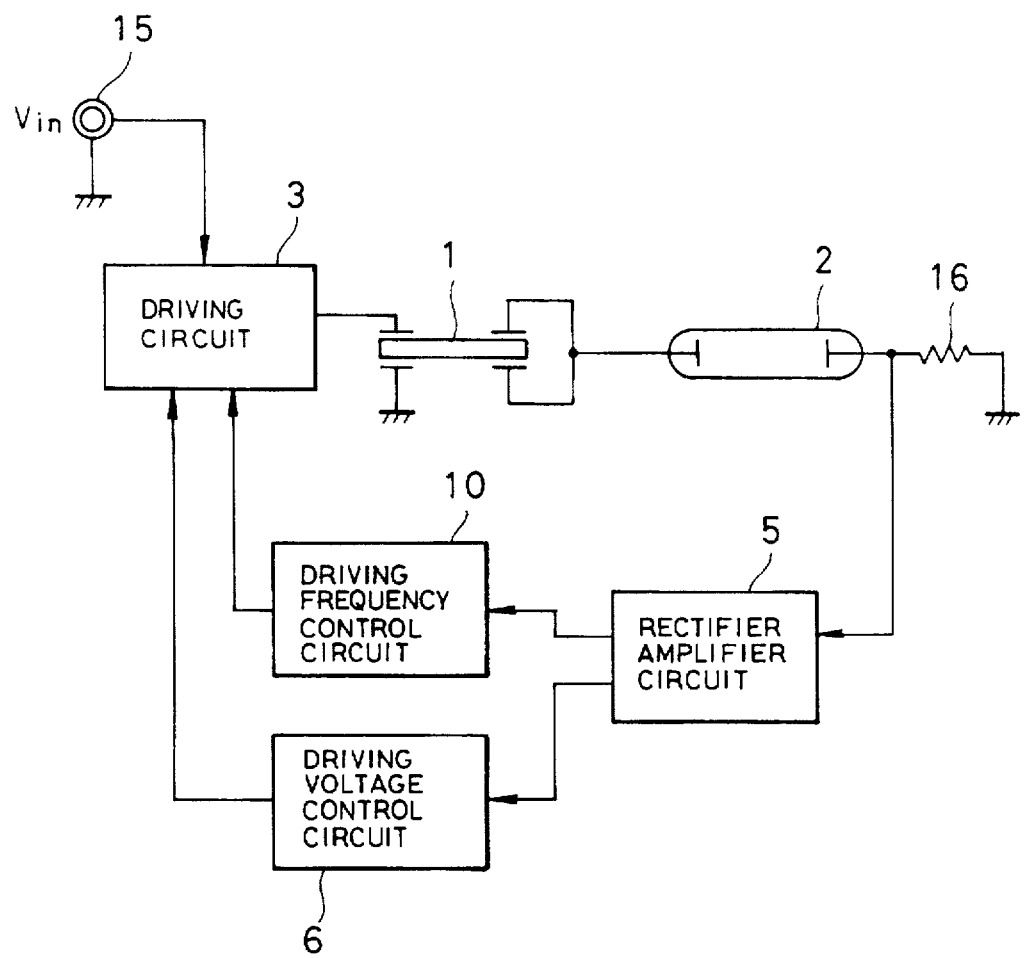
FIG. 8 is a block diagram showing another example of the prior art.

After ON-set, initialization is performed in the control circuit 14 at step 100 of FIG. 5. Next, to make the driving voltage of the piezoelectric transformer 1 maximum, the CPU 14-6 sets Vd to the minimum voltage V0 via the D/A converter 20 and the output I/F 14-1, at step 101. Step 102 is a process for setting the driving frequency at fmax. Steps 103 and 104 are processes for scanning the driving frequency up to the frequency f1 where the set current is obtained by lowering of the frequency. Subsequently, by processes of steps 106 to 115, the most efficient frequency $f\eta$ is detected. After a timing where step 115 is completed, the digital value of the control voltage to be applied to the driving frequency control circuit 10 is stored in the frequency register 14-8. By subsequent steps 116 to 121, the driving frequency is risen to $f\eta$ and fixed thereat. Thereafter, operation is performed by controlling the driving voltage to be applied to the piezoelectric transformer 1 to maintain the output current at the set value. Subsequently, at step 122, elapsing of given period after the mode enters into Vmode3 is checked to regularly execute the process of Vmode2. Then, the most efficient frequency $f\eta$ is again measured to execute the operation of Vmode3 at step 116 and subsequent steps.

When the most efficient frequency $f\eta$ is regularly measured, the driving frequency be adapted even when the environmental temperature is varied or the load condition is varied to cause variation of the most efficient frequency. Therefore, by setting the time interval for measuring the most efficient frequency, efficient driving condition can be constantly maintained.

It should be noted that since the circuit of FIG. 2 is performing operation in digital manner, it does not require adjustment and is adapted to pack into an LSI to permit down-sizing.

As set forth above, according to the present invention, since the frequency for driving the piezoelectric transformer is set at the frequency to attain the maximum efficiency and the driving voltage of the piezoelectric transformer is controlled to maintain the output current of the piezoelectric transformer at the set value, even when the environmental temperature is varied or the load condition is varied, efficient driving condition can be constantly maintained.

Also, by determining the driving frequency by detecting the frequency to attain the maximum efficiency, regularly, even when the environmental temperature is varied or the load condition is varied efficient driving condition can be constantly maintained.

What is claimed is:

1. A power source unit comprising:

a piezoelectric transformer which converts an alternating voltage supplied to a primary side utilizing piezoelectric effect into an alternating voltage at a secondary side;

a frequency scanning circuit which outputs a scanning control signal;

a driving frequency controlling circuit which controls a driving frequency of said piezoelectric transformer;

a driving voltage controlling circuit which controls a driving voltage supplied to the primary side of said piezoelectric transformer in accordance with the output of said driving frequency controlling circuit;

an efficiency calculating circuit which calculates an efficiency of said piezoelectric transformer by utilizing an input power and an output power of said piezoelectric transformer;

a maximum efficiency frequency detecting circuit which detects a driving frequency of said piezoelectric transformer corresponding to a maximum efficiency of said piezoelectric transformer based on an output of said efficiency calculating circuit; and a control circuit which detects a first driving frequency when an output of said piezoelectric transformer at the secondary side becomes a predetermined value, said control circuit outputting a first control mode signal to said frequency scanning circuit to initiate scanning of the driving frequency from said first driving frequency, said driving frequency controlling circuit receiving said scanning control signal from said frequency scanning circuit in order to control the driving frequency;

wherein said control circuit outputs a second control mode signal that is received by said maximum efficiency frequency detecting circuit which outputs said driving frequency of said piezoelectric transformer corresponding to said maximum efficiency of said piezoelectric transfer to said driving frequency controlling circuit so that said driving voltage controlling circuit can control the driving voltage based on the output of said driving frequency controlling circuit such that the piezoelectric transformer operates with said maximum efficiency.

2. A power source unit as set forth in claim 1, wherein said maximum efficiency frequency detecting circuit is controlled by said control circuit to repeat the detection of said driving frequency of said piezoelectric transformer corresponding to said maximum efficiency of said piezoelectric transformer at a predetermined interval after the driving voltage controlling circuit has controlled the driving voltage such that the piezoelectric transformer operates with said maximum efficiency, and wherein said maximum efficiency frequency detecting circuit is controlled by said control circuit to output to said driving frequency controlling circuit a new driving frequency of said transformer corresponding to a maximum efficiency of said piezoelectric transformer.

3. A power source unit as set forth in claim 2, wherein said frequency scanning circuit is controlled by said control circuit to output said scanning control signal such that said driving frequency controlling circuit controls said driving frequency to be within a frequency range from said first driving frequency to a second frequency which corresponds to said predetermined value.

4. A power source unit as set forth in claim 3, wherein said driving frequency controlling circuit includes a voltage controlled oscillation circuit which outputs a signal which oscillates at a frequency between said first driving frequency and said second driving frequency, said driving voltage controlling circuit includes a level comparing circuit for comparing a level of said signal output by said voltage controlled oscillation circuit with a threshold voltage, and said piezoelectric transformer is driven in accordance with an output of said level comparing circuit.

5. A power source unit as set forth in claim 4, wherein said output of said voltage controlled oscillation circuit is a triangular wave and the output of said level comparing circuit is a drive pulse having a duty ratio corresponding to the level of said threshold voltage.

6. A power source unit as set forth in claim 5, wherein said threshold voltage is a constant voltage where the driving voltage becomes the maximum value before the secondary output of said piezoelectric transformer reaches the predetermined value.

7. A power source unit as set forth in claim 5, wherein said threshold value is a voltage proportional to the secondary output voltage of said piezoelectric transformer after the secondary output of said piezoelectric transformer reaches the predetermined value.

8. A power source unit as set forth in claim 1, wherein said control circuit comprises a microprocessor.

* * * * *